United States Patent [19]

Jones

[11] 4,263,392
[45] Apr. 21, 1981

[54] ULTRA HIGH SPEED PRESENSITIZED LITHOGRAPHIC PLATES

[75] Inventor: Thomas H. Jones, Naperville, Ill.

[73] Assignee: Richardson Graphics Company, Des Plaines, Ill.

[21] Appl. No.: 44,531

[22] Filed: Jun. 1, 1979

[51] Int. Cl.³ .............. G03C 1/54; G03C 1/71; G03F 7/08

[52] U.S. Cl. .................. 430/169; 430/156; 430/162; 430/168; 430/175; 430/176; 430/302; 430/327; 430/935; 427/352; 427/353; 427/354

[58] Field of Search .............. 430/168, 169, 175, 176, 430/327, 302, 932, 935, 156, 162; 427/352, 353, 354

[56] References Cited

U.S. PATENT DOCUMENTS

| | | | |
|---|---|---|---|
| 3,136,637 | 6/1964 | Larson | 430/162 |
| 3,353,984 | 11/1967 | Landau | 430/168 |
| 3,544,317 | 12/1970 | Yonezawa et al. | 430/176 |
| 3,751,285 | 8/1973 | Ruckert et al. | 430/168 |
| 3,905,815 | 9/1975 | Bonham | 430/156 |
| 3,933,499 | 1/1976 | Traskos | 430/156 |
| 4,020,762 | 5/1977 | Peterson | 430/302 |
| 4,092,170 | 5/1978 | Houtermans et al. | 430/175 |
| 4,104,072 | 8/1978 | Golda et al. | 430/156 |
| 4,116,695 | 9/1978 | Mori et al. | 430/168 |
| 4,154,613 | 5/1979 | Doering | 430/168 |

*Primary Examiner*—Charles L. Bowers, Jr
*Attorney, Agent, or Firm*—Lockwood, Dewey, Alex & Cummings

[57] ABSTRACT

Presensitized lithographic plates having a diazo layer are prepared such that they exhibit a photospeed rendering them suitable for ultra high speed operations including use within laser platemaking systems. These ultra high speed plates have a diazo layer that is exceedingly thin while still being generally uniformly distributed throughout the plate area. The process includes extracting a significant quantity of diazonuim compound or diazonium resin from a diazo layer on a presensitized plate substrate. Plates thus formed are useful in laser exposures for facsimile transmissions, as projection plates, as camera back plates, for step and repeat plate work, and where low intensity light sources are used in conjuction with very large plates.

26 Claims, No Drawings

ULTRA HIGH SPEED PRESENSITIZED LITHOGRAPHIC PLATES

BACKGROUND AND DESCRIPTION OF THE INVENTION

This invention generally relates to lithographic plates of the ultra high speed variety, especially those that are fast enough to be suitably exposed by a laser beam. More particularly, the present invention is directed to improvements in the manufacturing and processing of plates through the use of an extraction technique and also to the ultra high speed plates produced thereby which have an exceedingly thin layer of diazonium compound or diazonium resin that is generally uniformly located on the plate, which layer is capable of satisfactory imaging by a short time exposure such as that provided by a laser beam or such as that practiced when one or more exposures of short duration are proceded with. It is generally preferred that the diazo layer be overcoated with a polymer layer and that diazo extraction be carried out through such polymer overlayer.

Presensitized plates exhibiting very rapid photospeeds are known and include plates having a diazonium compound or diazonium resin layer overplated with photopolymer overcoatings, this type of plate being described, for example, in Thomas et al U.S. Pat. Nos. 3,808,004 and 4,133,685, the disclosures thereof being incorporated by reference hereinto. Although these plates do exhibit very rapid photospeeds, such speeds typically are not adequate for use within systems that include exposure steps that are of the laser speed variety or are similar in overall exposure time to laser systems, referred to herein as ultra high speed systems.

Ultra high speed exposures may be accomplished, for example, with conventional lithographic plate exposure units by exposing the plates for a time period that is extremely short when compared with that needed for adequate exposure in the particular unit of lithographic plates that are not of an ultra high speed character. Typically, an ultra high speed plate will be satisfactorily imaged with an exposure time that is between about 4 to 10 times faster than the usual exposure time needed for the particular type of unit. Such conventional exposure units generally utilize actinic energy sources that are of a broad-band variety which encompass both visible and ultraviolet and/or infrared wavelengths, for example as generated by a mercury vapor lamp, a pulsed xenon lamp, or a rare earth metal halide doped mercury lamp. Presensitized plates usually will be responsive to energy across a range of wavelengths that is of a breadth on the order of the broad-band variety output of these conventional exposure units.

With laser exposures, the exposures are often of about the same general magnitude as exposures for ultra high speed applications of conventional exposure units, but laser systems will provide a much narrower, usually a single wavelength, spectral bandwidth and a much greater light intensity than those developed by the conventional exposure units, and will typically be applied in an overlapping, scanning manner in order to expose the entire plate and avoid the formation of scan lines on the exposed plates. Because of differences such as these, it is not a foregone conclusion that a plate suitable for conventional exposure will respond to a laser exposure source in the same manner or as satisfactorily as it will respond to a conventional unit. An important difference in observed response is the step wedge transmission pattern that is exhibited by a laser exposure compared with a conventional exposure, which difference is due in part to the fact that conventional step wedges are intended for exposure by conventional light sources. Roughly speaking, a step 2 image formed by a laser exposure source would designate an exposure as satisfactory as a step 5 image formed by a conventional exposure source. For example, a step 2 image made by an ultraviolet laser represents a laser transmission of about 40%, while a step 5 image made by a particular conventional exposure source having visible bands represents a transmission of about 25 to 30% of that conventional source.

Ultra high speed exposures have certain advantages that cannot be attained by conventional plates, even presensitized plates of rapid photospeeds. Advantages such as cost, labor and time savings and the ability to be adapted for advanced systems, including facsimile transmission and computer printing are discussed in "Laser Platemaking Systems For the Printing Industry", R. E. Amtower, presented at Electro-.ptics/Laser Conference and Exhibition, New York, September, 1976; and "Computers To Plates-A Realty", L. G. Larson, presented at PIRA Symposium, London, 1977.

Lithographic plates of the non-presensitized, wipe-on variety or of the electrostatic variety have been produced for use in plate making systems that utilize exposure methods and devices of the laser type. Electrostatic laser-speed lithographic plates are not of the diazo type, and they are much more expensive than diazo or photopolymer plates.

Lithographic plates of the wipe-on type that exhibit photospeeds suitable for ultra high speed uses retain the typical disadvantages of conventional wipe-on plates, including relatively short shelf life properties, poor roll up attributes, undesirable physical appearance of the plates, frequency of unsuitable processing by the user and resultant waste, difficulty of achieving a uniform coating to avoid inferior dot structure, lower overall printing quality largely due to a typically low number of line screens. Typically, special diazo solutions must be used when ultra high speed wipe-on plates are prepared, and such solutions must be applied in a very thin layer just prior to exposure, whether application be by a skilled operator or by a wipe-on solution applicator machine. Wipe-on plates cannot be put into direct use, but must be first processed through the wiping opertion.

The present invention relates to presensitized diazo plates that are satisfactory for use within ultra high speed systems, such as: those requiring projection plates, where an image is projected from a slide onto an offset plate; camera back plates, where an offset plate is used to take an image in a camera and in which a film step is eliminated; those including step and repeat and work, where many repetitive exposures must be made; systems incorporating laser exposures for facsimile transmissions; computer to press systems that require laser speed plate making; uses for preparing oversized plates, typically utilizing low intensity light sources; or use in newspaper printing where inexpensive ink and paper are used and lint build up is a serious problem. Plates according to this invention are suitable for high volume reproduction operations such as that needed for newspapers, directories, business forms, multiple listings, and the like.

Presensitized diazo plates according to this invention exhibit the superior run length and roll up properties typically associated with presensitized lithographic diazo plates while also exhibiting photospeeds suitable for ultra high speed exposure techniques. These plates have an exceedingly thin, yet generally uniform diazo layer that is residual diazonium compound or diazonium resin retained on the plate after extraction of substantially all of an initial diazo layer from off of the plate substrate. In an important aspect of the method of this invention, a sensitizing or extracting agent is put into contact with a plate having a presensitized layer including a diazonium compound or diazonium resin, and the sensitizing or extracting agent, which is a liquid that will solubilize the diazo material but will not solubilize, soften, damage, swell, or otherwise adversely affect the rest of the plate that preferably includes a photopolymer, is subsequently removed from the plate together with a substantial amount of the diazonium compound or diazonium resin.

It is a general object of this invention to provide an improved ultra high speed lithographic plate.

Another object of the present invention is to provide a product and processes for making a presensitized lithographic plate of the ultra high speed variety suitable for use in systems that incorporate laser exposure of plates.

Another object of this invention is to provide an improved presensitized lithographic plate and methods for preparing same, which plate is suitable for use in projecting an image from a slide onto an offset plate.

Another object of this invention is to provide an improved presensitized lithographic plate and method for making same, the plate being suitable for use in taking an image in a camera, whereby a film step is eliminated.

Another object of this invention is a presensitized lithographic plate and method for making same, which plate is suitable for step and repeat work when many repetitive exposures must be made.

Another object of the present invention is to provide an improved lithographic plate and method for making same that is suitable for exposure by low intensity light sources, especially when the plates are oversized.

Another object of this invention is an improved presensitized lithographic plate and method for making same that is suitable for use within facsimile transmissions, especially those in conjunction with computer to plate composing and printing operations for high volume and remote printing using scanning laser systems.

These and other objects of this invention will be apparent from the following further detailed description thereof.

Ultra high speed lithographic plates according to this invention include a substrate that is suitable for accepting, with good adhesion, a diazo substance, the ultra high speed plate further including an extremely thin layer of such diazo substance, said layer being adequately adhered to the substrate. Preferably, a polymeric substance is also included on the substrate, such polymer being provided for the purpose of protecting the diazonium compound or diazonium resin and/or enhancing its photospeed.

Substrates suitable for the present invention can be of any type that will be strongly adhered to by a diazo substance, which adhesion can be enhanced by chemical means, substrates of paper, plastic or metal being useful. Diazo to substrate adhesion can be increased by a substrate surface exhibiting surface roughness such as a grained surface formed by ball graining, chemical graining, brush graining or the like. Surface hardness of the substrate and enhanced diazo adhesion thereto can be brought about by anodizing. In addition, the substrate may be subjected to steps such as etching, coating or rinsing prior to diazo addition. Whatever substrate treatment is used, it is important to good adhesion that the plate be clean and free of oil.

Almost any diazonium compound or diazonium resin suitably functions as the diazo layer, whether the diazo be water soluble or solvent soluble, it being an important aspect of this invention that the diazonium compound or diazonium resin exhibit at least a minimal solubility within the extracting agent of this invention. Typical diazonium compound or diazonium resin are described in U.S. Pat. Nos. 2,100,063, 2,667,415, 2,679,498 and 2,958,599. An example of a diazo resin of the negative-working type is prepared by condensing paraformaldehyde with p-diazo-diphenylamine sulfate in the manner set forth in U.S. Pat. No. 2,100,063. The diazonium compound or diazonium resin, which may be applied to the substrate by any means, such as by the well-known procedures of dipping, spraying, roller coating, brushing, or the like, can be one or more water-soluble or solvent-soluble diazo substances applied in one or more layers of only diazonium compound or diazonium resin or of a combination of diazonium compound or diazonium resin and another component, such as a polymeric substance.

Plates according to this invention have an exceptionally thin diazo layer that is of a residual thickness remaining on the plate substrate after extraction of diazonium compound or diazonium resin from a diazo layer of a thickness greater than this residual thickness, the residual thickness believed to be in the general nature of a substantially monomolecular layer that is extensive enough to provide a diazo layer that, although it can exhibit discontinuities, it will form a printed image that is continous to the unaided eye. The residual thickness material is thick enough to provide for an adequate image formation and to cause polymer, if present, to cross-link and adhere to the plate surface upon exposure, but being thin enough to bring about ultra high speeds characteristic of this invention. While it is presently believed that the residual thickness diazo layer of plates according to this invention is no greater than about 0.05 mg./sq.ft, a method for actual measurement in this regard is not known at present; visible spectroscope measurements made in the near ultraviolet range on washing solutions applied to plates having a residual thickness diazonium compound or diazonium resin do not detect the presence of any diazo material.

Polymeric substances are preferably included on the substrate as a layer that is over or that includes the diazonium compound or diazonium resin, the layer being thin enough to permit passage of the diazonium compound or diazonium resin out of or through such layer by operation of the extracting agent of this invention, a typical polymer layer being of a thickness no greater than about 200 mg of polymer per square foot of substrate surface area, typically between 5 and 120 mg, the preferred thickness varying with the coverage characteristics of the particular polymer and with the roughness of the substrate, a usual preferred range being between about 10 and about 100 mg/sq.ft. The polymer should be of a thickness such that it is not completely continuous to the extent that the extracting agent can pull substantially all of the diazonium compound or diazonium resin therethrough, and it is believed that such a property is enhanced somewhat when the substrate is grained, unetched, or otherwise exhibits surface irregularities so that the polymer layer thereover is more likely to have discontinuities for enhancing passage of diazonium compound or diazonium resin therethrough. In a very general sense, the polymer layer can be thought of as being microscopically pin-holed or cracked, the pin-holding in general being brought about by a combination of the thickness of the polymer layer, the roughness of the substrate surface, and perhaps most importantly the drying properties of the particular polymer, pin-holing being more likely to develop when the applied polymer formulation includes a solvent that escapes through the polymer on setting and when relatively fast or harsh drying conditions were present.

When the polymeric substances are included on plates according to this invention, they provide protection for the extremely thin diazo layer, they serve as an advantageous medium through which the diazonium compound or diazonium resin are extracted, they can provide coloration when dyes or pigments are included, and preferably they also are of a type that will even more greatly increase the photospeed of the extremely thin diazo layer. Polymeric substances include resinous materials that provide little or no photospeed enhancement or photopolymers such as those described in U.S. Pat. No. 3,808,004, which can be generally thought of as cinnamoylated photopolymers. These polymeric materials include phenoxy cinnamate photopolymers, polyvinyl cinnamate photopolymers, bisphenol-A fumarate polyester cinnamate photopolymers, polycarbonate cinnamate photopolymers, polyurethane cinnamate photopolymers, photopolymeric alkyd resins, sensitized aryl allyl ester polymers as discussed in U.S. Pat. No. 3,462,267, polycarboxylic acid polymers as discussed in U.S. Pat. No. 3,136,636, isocyanate-modified polyfunctional ethylenically unsaturated polymers as discussed in U.S. Pat. No. 3,840,369, polymers of o-nitro-carbinol esters of ethylenically unsaturated carboxylic acids as discussed in U.S. Pat. No. 3,849,137, and polyvinylformal resins, vinyl polymers, epoxy resins, alkyd resins, polyamide resins, phenolaldehyde resins, ureaaldehyde resins, cellulose acetate butyrate, polyalkylene-polysulfide resins, and silicon containing resins as discussed in U.S. Pat. No. 3,136,637.

Optionally included on plates according to this invention are stabilizers, which are most conveniently added with the extracting agent at up to 2 weight percent of the composition, for enhancing the shelf life of these plates after their photospeed has been significantly enhanced by thinning the diazo layer. Stabilizers include zinc chloride, phosphoric acid, hydrochloric acid, acetic acid, citric acid, sulfuric acid, tartaric acid, p-toluene sulfonic acid, fluoboric acid, or combinations thereof, or the like.

In proceeding with the plate-modifying method according to this invention, an important aspect thereof is the step of treating a plate having a substrate and a diazo layer with an extracting agent in order to remove substantially all of the diazo layer to thereby leave an exceedingly thin, residual thickness layer of diazonium compound or diazonium resin, which exceedingly thin layer exhibits ultra high photospeeds that are suitable for laser-type operations. In one aspect of this invention, presensitized diazo plates are thus treated in order to transform them from conventional speed or relatively high speed plates into ultra high speed plates. Typically, plates so produced will be fast enough to be adequately exposed by ultraviolet laser unit when supplied with on the order of about 10 millijoules of laser energy per square centimeter of plate surface.

More particularly, the treatment step or procedure according to this invention includes applying a liquid extracting agent to a presensitized diazo lithographic plate in order to form the exceedingly thin, residual thickness diazo layer by extracting off of the plate surface substantially all of the diazonium compound or diazonium resin until what is believed to be greater than about 90, and more probably greater than approximately 99 weight percent of the initial diazo layer has been extracted, and then removing the agent and extraced diazonium compound or diazonium resin from the surface of the plate. Usually, carrying out the treatment step a plurality of times on each plate will enhance the photospeed to a greater extent than does a single treatment step.

In its simplest form, the step of applying the extracting agent to the plate is one of contacting the plate with the liquid agent to extract the diazo, and the removing step is one of permitting the plate to dry in order to terminate extraction prior to use of the plate. Other applying techniques can include dipping or immersing the plate within a container or tray of the extracting agent, or by passing over the plate a sponge containing the extracting agent, although a more controlled applying procedure has been found to be brought about by applying the agent with a developing pad or the like, such as a rubberbacked, short-brushed plush, or synthetic fur of relatively short length, on the order of ⅛ inch.

Especially suitable for the applying and removing steps is any operation which puts the extracting agent liquid into contact with the total plate surface area, permits excess liquid to drain off the plate, and physically removes by scraping, wiping or the like substantially all of the remaining diazo-containing extracting liquid from off of the plate, after which the plate is permitted to dry. An especially suitable combination for completing the treatment includes dipping the plate within a tray or other container of extracting agent, holding the liquid on the surface for a length of time adequate to extract the diazo, and then wiping the surface with a squeegee or the like. Typical holding times generally are not much longer than about 3 minutes, usually between about 2 seconds and 2 minutes, preferably between about 5 and 60 seconds, while an especially preferred holding time for many presensitized diazo plate and extracting agent combinations is between about 10 and 45 seconds. Particularly suitable for carrying out substantially all of these steps of the treating procedure is the use of a conventional mechanical plate wipe-on apparatus which automatically immerses, drains, and wipes the plates, making them ready for ultra high speed uses after the plates dry.

Optionally included within the treating procedure can be a rinsing step, which enhances removal of the diazo-containing extracting agent from the plate by passing a rinsing agent over the plate. Typical rinsing agents are aqueous liquids, such as deionized water or tap water, and a typical rinsing step will pass a supply of rinsing agent over the surface of the presensitized ultra high speed diazo lithographic plate. When a stabilizer is to be included, it can advantageously be added to the rinsing agent.

By this treating procedure, a solubilizing substance is utilized as an extracting agent and has the effectiveness of an ultra high speed sensitizing agent. For a solubilizing substance to be a suitable extracting or sensitizing agent, it should be one in which the diazonium compound or diazonium resin is highly, either totally or partially, soluble while at the same time being a substance that will not significantly solubilize, soften, damage, swell or otherwise adversely affect the rest of the plate, particularly the photopolymer when present. Solubilizing substances include tap water, deionized water, aqueous solutions or blends including surfactants, solvents and/or other acidic, basic or salt additives. Typically, organic solvents by themselves or in high concentrations are useful only when the diazo material is of the solvent-soluble, as opposed to the water-soluble type for which the other exemplified solubilizing substances are most suitable. The aqueous solutions or blends can include: at least about 30 weight % water, preferably at least 50%, often most suitably at least 75% water; up to 1% surfactant, preferably 0.001-0.1%; and up to 70 weight % solvent, preferably no more than 25%. When present, the surfactants and solvents lower the surface tension within the system to allow the solubilizing substance or extracting agent to wet and to penetrate the polymeric substance more readily, while at the same time facilitating a more uniform and what is believed to be a more rapid wash out of the diazonium compound or diazonium resins. The other additives are included to add dissolved minerals to the system, to adjust the pH, and/or to assist in stabilizing the ultra high speed plates once they are sensitized.

Exemplary surfactants include high to moderately low molecular weight bis-(polyethoxylated) poly (propylene glycol) hydrophilic nonionic surfactants, cationic surfactants such as a 50/50 mixture of water and methyl dodecyl benzyl xylene bis-trimethyl ammonium chloride, and anionic surfactants such as sodium dioctyl sulfosuccinate, or combinations thereof. Solvents include alcohols such as ethanol, n-propanol, isopropanol and diacetone alcohol; 2-methoxyethanol; 2-ethoxyethanol; glycols such as ethylene glycol or propylene glycol; polymer solvents, if at especially low concentrations, such as 2-ethoxyethyl acetate, dioxane or tetrahydrofuran; and combinations thereof. Acidic, basic or salt other additives include phosphoric acid, citric acid, acetic acid, ammonia, magnesium carbonate, calcium carbonate, sodium chloride, ammonium acetate, sodium bisulfate, sodium bisulfite, magnesium nitrate, sodium bicarbonate, sodium carbonate, citric acid monhydrate, anhydrous sodium acetate, sodium acetate trihydrate, 10° Be gum arabic solution, zinc chloride, hydrochloric acid, sulfuric acid, tartaric acid, p-toluene sulfonic acid, fluoboric acid, and combinations thereof. The pH of the extracting agent composition generally can range between 1 and 12, preferably not above about 7, and, especially when shelf-stability is to be enhanced, between 2 and 6. When the higher pH compositions are used, the overall alkalinity imparted thereby should be low enough to be overcome by the dominantly acidic diazonium compound or diazonium resin.

The plate making method according to this invention includes coating a plate having a backing of paper, plastic sheet, aluminum, zinc, copper, other metal or the like. Preferably, such backing is processed in order to form a treated substrate enhanced in its ability to adhere diazo materials thereto, such as by rendering the surface hydrophilic by any one of various possible combinations of steps, including graining, etching, anodizing, rinsing, and coating with a subbase or combination of subbases such as a phytic acid subbase as described in U.S. Pat. No. 3,307,951, a melamine-formaldehyde condensation resin overcoated with a poly-acrylamide as described in U.S. Pat. No. 3,073,723, a ureaformaldehyde subbase as in U.S. Pat. No. 3,136,636, a titanium ortho ester subbase of U.S. Pat. No. 3,231,376, a silane-acrylic subbase of U.S. Pat. No. 3,163,534, a silicate subbase of U.S. Pat. No. 2,714,066, the subbase of U.S. Pat. No. 3,261,285, a gelatin, a polyacrylic acid and water-soluble salts thereof, a polymethacrylic acid and water soluble salts thereof, a carboxy-methyl cellulose, a carboxymethyl hydroxyethyl cellulose, a titanate, a modified resin of urea-formaldehyde and melamine-formaldehyde, a polyvinyl alcohol, a ferrocyanide of sodium, potassium or ammonium, a bichromate of sodium, potassium or ammonium, or, when the substrate is a metal, an oxide thereof.

A layer containing a diazonium compound or diazonium resin is coated onto the backing or the treated substrate, this layer being substantially entirely a single diazo or a combination of different diazo materials, although optionally, the diazonium compounds or diazonium resins material may be applied in combination with a polymeric substance, the thickness of the applied diazonium compound or diazonium resin coating layer being between about 1 and about 10 mg, preferably between about 3 and about 8 mg, of diazo per square foot of substrate or backing surface area, although the diazo layer could be as high as about 50 mg. per square foot.

Preferably, the diazo layer is next overcoated with a layer of polymeric substance which exhibits protective properties and which in addition preferably exhibits properties whereby photospeed increase is realized, any such polymeric substance layer being of a thickness that permits removal of diazo resin therethrough, such a thickness typically being no more than approximately 120 mg of polymer for each square foot of plate surface area.

Thereafter, the treating procedure according to this invention is proceeded with, during which the solubilizing or extracting agent that performs as an ultra high speed sensitizing agent according to this invention is applied to and removed from the presensitized diazo lithographic plate. After the thus prepared plate is dry, it is suitable for use in ultra high speed systems.

Ultra high speed exposures may be attained by non-laser units at exposure times that are significantly shorter than needed for plates that are not of the ultra high speed variety. Laser exposure systems are also suitable for satisfactorily exposing the ultra high speed plates of this invention, possible laser types being dependent upon the particular diazonium compound or diazonium resin, representative types being ultraviolet lasers such as UV argon and UV krypton whether water-cooled or air-cooled; visible lasers such as argon visible or krypton violet; and infra-red or near infra-red lasers. Typical laser scanning systems will scan an entire newspaper-sized plate in approximately one minute.

The following specific examples will more precisely illustrate the invention and teach the procedures presently preferred for practicing the same, as well as the improvements and advantages realized thereby. When non-laser, light source exposure units were used, the data is capable of conventional interpretation of the step wedge results reported in these examples, an increase of 2 steps represents a photospeed increase of about 4 times, and a 6-step increase evidences a photospeed increase of about 8 times.

EXAMPLE 1

Several runs were made in accordance with this invention wherein the treating procedure used water as the exclusive solubilizing or extracting agent, the runs being varied to compare the effectiveness of tap water with the effectiveness of deionized water as an extracting agent. Two subtractive photopolymer lithographic plates having a water-soluble diazo layer overcoated with a polymer layer applied at about 50 mg/sq. ft. prepared from the same coil of aluminum backing were subjected to a single applying or pre-washing step by using a lint-free cotton lithographic pad, the extracting agent in one case being deionized water and in the other case being tap water. The ultra high speed plates so produced were held for less than one-half hour, after which each was exposed for 2 seconds by a 4,000 watt Nuarc exposure unit with pulsed xenon lamp (Model FT40L) through a standard Stouffer Sensitivity Guide gave, after development with a subtractive developer, the following image step results, where the terms full step and visible step have their conventional meanings, full step being the highest numbered step having full maximum density that is generally equivalent to exposure through a clear area of negative, while visible step refers to the last numbered visible step having significant density above that of the background. The deionized water sensitized plate imaged to a full step of 2 and a visible step of 4, while the tap water sensitized plate imaged to a full step of 3 and a visible step of 5, in both instances the quality being such that the image was readily visible and strong, while the background was clean, illustrating that the ultra high speed plate prepared with the tap water extracting agent was somewhat faster than that prepared with the deionized water extracting agent.

EXAMPLE 2

Two subtractive photopolymer lithographic plates, similar to those of Example 1 but having a thicker polymer layer, and prepared from the same coil of aluminum backing were subjected to the same treatment steps as those of Example 1, here the tap water imaging results being a full step of 3 and a visible step of 6 while the deionized water imaging results were a full step of 1 and a visible step of 3, which difference is roughly indicative of a threefold faster photospeed for the tap water sensitized plate than for the deionized water sensitized plate.

EXAMPLE 3

Example 2 was substantially repeated, except both the tap water and the deionized water extracting agents included 0.05 weight percent of a high molecular weight bis-(polyethoxylated) poly (propylene glycol) hydrophilic nonionic surfactant. The deionized water extracting agent had a full step of 1 and a visible step of 3, while the tap water extracting agent had a full step of 3–4 and a visible step of 6. It was observed that the presence of the surfactant enhanced the uniformity of the wash out on the entire plate surface.

EXAMPLE 4

Several runs were made on plates of the general type used in Example 2, using a variety of extracting agent compositions that were formulated by adding surfactant and/or an acid, base or salt additive to deionized water, all of the plates originating from the same coil, the pre-wash being a single application with a lint-free cotton lithographic pad, followed by a hold time of less than one-half hour and exposure for 2 seconds with a model FT40L Nuarc exposure unit through a Stouffer Sensitivity Guide, followed by development with a subtractive developer. Image steps are reported in Table I, as is the quality of the image.

TABLE I

| Run No. | Surfactant | Additive (wt. %) | Full step | Vis. step | Quality |
|---|---|---|---|---|---|
| 1 | none | $H_3PO_4$ (0.05) | 0–1 | 2 | weak |
| 2 | none | Citric (1.0) | 0–1 | 3 | weak |
| 3 | none | Acetic (5.0) | 0–1 | 2–3 | weak |
| 4 | none | Ammonia (5.0) | — | — | slight |
| 5 | none | $MgCO_3$ (0.008) | 3 | 4 | strong |
| 6 | none | $CaCO_3$ (0.015) | 3–4 | 6 | strong |
| 7 | none | NaCl (1.0) | 0 | — | slight |
| 8 | yes | $NH_4Ac$ (0.2) | 3 | 7–8 | strong |
| 9 | yes | $NH_4Ac$ (0.5) | 2 | 5 | strong |
| 10 | yes | $NH_4Ac$ (1.0) | 3 | 8 | strong |
| 11 | yes | $NH_4Ac$ (2.0) | 3 | 6 | strong |
| 12 | none | $NaHSO_4$ (0.5) | 2 | 3 | strong |
| 13 | none | $Mg(NO_3)_2$ (1.0) | 0 | 0 | slight |
| 14 | none | $ZnCl_2$ (5.0) | 0 | 0 | slight |
| 15 | none | $ZnCl_2$ (1.0) | 0 | 1 | weak |
| 16 | none | $NaHSO_3$ (1.0) | 0 | 0 | slight |
| 17 | none | $NaHCO_3$ (0.5) | 3–4 | 6 | strong |
| 18 | none | $Na_2CO_3$ (1.0) | 0 | 0 | slight |
| 19 | none | $Na_2SO_3$ (1.0) | 0 | 0 | slight |
| 20 | yes | NaAc (0.5) | 3 | 5 | strong |
| 21 | none | NaAc (0.1) | 2–3 | 6 | strong |
| 22 | none | NaAc (0.2) | 3 | 6 | strong |
| 23 | none | NaAc (0.5) | 3–4 | 6–7 | strong |
| 24 | none | NaAc (1.0) | 3 | 6–7 | strong |
| 25 | none | NaAc (2.0) | 3 | 6 | strong |

A dash in the image step columns means background scum obscured the steps. A "weak" quality means that the image was non-uniform or not of full density; a "slight" quality indicates that no image or only a very slight image was visible, and "strong" means that the image was readily visible and strong. In each run, the background was clean, with the exception of run number 4, where the large amount of ammonia within the extracting agent apparently led to scum formation and undevelopability of the plate. Runs 1 through 4 illustrate the use of aqueous solutions of several acids and a base within the sensitizing or extracting agent, runs 5 and 6 illustrate the use of neutral solutions of salts at approximately the concentrations that they tend to be found in tap water, runs 7–11 show using neutral salts at concentrations greater than those of tap water, runs 12–16 illustrate acidic salt solutions, and runs 17–25 illustrate alkaline solutions. The surfactant used in these runs was 0.05 weight percent of a high molecular weight bis-(polyethoxylated) poly (propylene glycol) hydrophilic nonionic surfactant. "Citric" designates citric acid monohydrate, and "NaAc" designates anhydrous sodium acetate, or equivalent amount of trihydrate.

EXAMPLE 5

Various runs were made with different prewashing or extracting agents applied either once or twice and by different application modes. These data are reported in Table II. In each run an alkaline salt solution was added, it being 0.5 weight percent of anhydrous sodium acetate, or equivalent amount of its trihydrate. The hold time after the applying steps in each case was less than one-half hour, exposure was for 2 seconds by a Model FT40L Nuarc exposure unit, development was with a subtractive developer, and in each case the background was clean. For run 35, the image quality was slightly weak, while in the remainder of these runs, the image was readily visible and strong. When present, the solvent was isopropanol. The data in Table II illustrate that a second treating operation enhances the photospeed, and the slightly weak and slower speed of run 35 indicates that a sponge is not as effective for use during the applying step as is a cotton applicator, a developer pad, or a bottle applicator, apparently because a sponge soaks up too much of the composition and pulls it away from the plate.

TABLE II

| Run No. | Surfactant (wt. %) | Solvent (wt. %) | Applying step mode | No. of Treatments | Full step | Vis. step |
| --- | --- | --- | --- | --- | --- | --- |
| 26 | 0.05 | none | cotton | 1 | 3 | 6 |
| 27 | 0.05 | none | cotton | 2 | 4 | 6 |
| 28 | 0.03 | none | cotton | 1 | 3 | 6 |
| 29 | 0.03 | none | cotton | 2 | 4 | 6 |
| 30 | 0.05 | 8.0 | cotton | 1 | 3 | 5 |
| 31 | 0.05 | 8.0 | cotton | 2 | 4 | 6 |
| 32 | 0.05 | 8.0 | pad | 1 | 3 | 5 |
| 33 | 0.05 | none | pad | 2 | 4 | 6 |
| 34 | 0.05 | none | bottle | 2 | 3 | 5 |
| 35 | 0.05 | 6.0 | sponge | 2 | 3 | 5 |

EXAMPLE 6

Runs were made illustrating improved photospeed available when solvents are included with the extracting agent, the plates used in this example being plates of, and made from the same coil as, each of Examples 2–5. The carrier for the prewash composition was deionized water, prewash application was with a 3R developer pad (Richardson Graphics Company), two applications were made, and the hold time between the second treatment procedure and the exposure was less than one-half hour, the exposure being through a Stouffer Sensitivity Guide by a Model FT40L Nuarc exposure unit, with the image quality being readily visible and strong, and the background being clean for each run.

An extracting agent including 6.0 weight percent of isopropanol only gave a full step of 4–5 and a visible step of 7; an extracting agent including 20 weight percent n-propanol gave a full step of 4–5 and a visible step of 7; while an extracting composition including 20 weight percent n-propanol, 0.01 weight percent of the nonionic surfactant of Example 3, and 0.1 weight percent of anhydrous sodium acetate or equivalent amount of its trihydrate gave a full step of 3–4 and a visible step of 6.

EXAMPLE 7

Several additional runs were made during which the length of time between the final treatment procedure and the initiation of exposure is varied to periods of time greater than one-half hour. The runs were made either on a plate from the same coil and of the same general type as Examples 2–6 or on one of several additive presensitized, water-soluble diazo photopolymer lithographic plates made from the same coil. Run data are reported in Table III, the subtractive plate identified by "Sub." and the additive plate by "Add." The surfactant, when present, was that of Example 3. In runs 36–39 the solvent was isopropanol, while in runs 40–53, the solvent was n-propanol. There were two treatment procedures in runs 36–47 and one treatment procedure in runs 48–53, and the extracting composition of runs 36–39 included 0.5 weight percent anhydrous sodium acetate, while that of runs 51–53 included 0.1 weight percent zinc chloride as a stabilizing agent. Enhanced stability is seen by comparing the severely toned background of run 50 with the improved background of run 53, which is only toned, indicating that that plate was partially undevelopable in a generally non-uniform manner. Runs 36–47 were exposed for 2 seconds by a Nuarc exposure unit, while runs 48–53 were exposed for one second with a 5,000 watt Berkey-Addalux exposure unit with rare earth metal halide doped mercury "diazo" lamp, this unit being 5 to 10 times faster than the Nuarc unit for exposing diazo-based plates. Runs 36–39 and 44–47 were developed with a subtractive developer, while runs 40–43 and 48–53 were developed with Richardson Graphics Company Black One Step additive developer. For each run, the image quality was readily visible and strong.

TABLE III

| Run No. | Plate Type | Surfactant (wt. %) | Solvent (wt. %) | Additive | Hold Time (hr.) | Full Step | Vis. Step | Background |
| --- | --- | --- | --- | --- | --- | --- | --- | --- |
| 36 | Sub. | 0.05 | 6.0 | NaAc | <.5 | 3 | 6 | clean |
| 37 | Sub. | 0.05 | 6.0 | NaAc | 1 | 2–3 | 6 | slight toned |
| 38 | Sub. | 0.05 | 6.0 | NaAc | 2 | 3 | 6–7 | slight toned |
| 39 | Sub. | 0.05 | 6.0 | NaAc | 3.5 | 2–3 | — | severe toned |
| 40 | Add. | none | 20.0 | — | <.5 | 3–4 | 8 | clean |
| 41 | Add. | none | 20.0 | — | 1 | 3–4 | 8 | clean |
| 42 | Add. | none | 20.0 | — | 2 | 3–4 | 8–9 | clean |
| 43 | Add. | none | 20.0 | — | 4 | 3–4 | 9 | clean |
| 44 | Sub. | none | 20.0 | — | <.5 | 4–5 | 7 | clean |
| 45 | Sub. | none | 20.0 | — | 1 | 4 | 6 | clean |
| 46 | Sub. | none | 20.0 | — | 2 | 3 | 6–7 | clean |
| 47 | Sub. | none | 20.0 | — | 19 | 2 | — | toned |
| 48 | Add. | 0.01 | 20.0 | — | <.5 | 4 | 7 | clean |
| 49 | Add. | 0.01 | 20.0 | — | 36 | 3 | 6 | toned spots |
| 50 | Add. | 0.01 | 20.0 | — | 48 | 3 | 8 | severe toned |
| 51 | Add. | 0.01 | 20.0 | ZnCl$_2$ | <.5 | 2 | 4 | clean |
| 52 | Add. | 0.01 | 20.0 | ZnCl$_2$ | 36 | 2 | 5 | toned |
| 53 | Add. | 0.01 | 20.0 | ZnCl$_2$ | 48 | 2 | 4 | toned |

EXAMPLE 8

In order to illustrate exposure times for plates not in accordance with this invention, three subtractive plates made of brush grained aluminum from the same backing coil, the backers being acid etched, anodized, and sub-based, followed by coating with a diazo layer that is overcoated with a blue cinnamate photopolymer layer at about 80 mg./sq.ft. were exposed by a Nuarc pulsed xenon lamp exposure unit for a selected period of time and then developed in the normal manner with a subtractive developer.

One of the samples was subjected to a generous exposure time of 45 seconds to form an image having a full step of 6–7 and a visible step of 8. A fast speed exposure time for the Nuarc unit of only 5 seconds of the second sample plate gave a full step of less than 1, with no subsequent visible steps being detectable. The third plate sample was treated in accordance with this invention by a 30 second treatment procedure using tap water, followed by a running tap water rinsing step, and it was then exposed for only 5 seconds in the same Nuarc exposure unit, the image formed being a full step of 6 and a visible step of 8, substantially the same as the first sample, indicating that the plate made in accordance with this invention was a satisfactory ultra high speed plate that performed as well as a conventional plate by an exposure time 9 times faster than the conventional plate.

EXAMPLE 9

In this example, a group of plates generally in accordance with Example 8 were made from the same backing coil and were treated with sensitizing extracting agent compositions of deionized water including an anionic, a cationic or a nonionic surfactant, followed by a tap water rinsing step, exposure within a Nuarc exposure unit, and development with developer. Treatment for 30 seconds with an anionic surfactant composition containing 1% sodium dioctyl sulfosuccinate resulted in a full step of 6-7 and a visible step of 9 when exposure proceeded for 45 seconds, while an exposure for 5 seconds resulted in a full step of 1 and a visible step of 3. Treatment for 30 seconds with another extracting agent composition containing 1% of a mixture of cationic methyl dodecyl benzyl trimethyl ammonium chloride and methyl dodecyl benzyl xylene bis-trimethyl ammonium chloride treated a plate that was exposed for 5 seconds, the full step being 4 and the visible step being 7. Three runs using a prewash composition including a low molecular weight nonionic surfactant including treatment times of 10 seconds, 30 seconds and 60 seconds, respectively, upon exposure for 5 seconds brought about an image of full step 5-6 and visible step 7, a full step of 6 and a visible step of 8, and a full step of 4-5 and a visible step of 7, respectively. Satisfactory high speed plates were formed according to this invention when the treating composition included either the cationic or the nonionic surfactant while that including the particular anionic surfactant was not particularly advantageous for the purpose of forming an ultra high speed plate.

EXAMPLE 10

Various runs were made with plates, each being made in substantially the same manner as Example 8, each beginning with the same plate backing coil, and each being exposed in a Nuarc unit, data for these runs being shown in Table IV. Runs 54–55 illustrate that plates not made according to this invention do not attain satisfactory imaging at 5 seconds, which imaging is provided by a 45 second exposure. Run 56, in which the sensitizing or extracting agent composition was anhydrous alcohol, did not test out as an ultra high speed plate, as is expected since the plate diazo is water-soluble, not solvent soluble. The flood of run 61 was provided by running tap water, while in runs 56–60 and 62–65, application was made with a cotton pad.

TABLE IV

| Run No. | Applying Step | Post-rinse | Exposure time (sec.) | Full Step | Visible Step |
|---|---|---|---|---|---|
| 54 | none | — | 45 | 4–5 | 7 |
| 55 | none | — | 5 | 0 | — |
| 56 | AnI | No | 5 | 0 | — |
| 57 | L-35 | No | 5 | <1 | — |
| 58 | tap water | Yes | 5 | 3–4 | 6 |
| 59 | L-35 | Yes | 5 | 3 | 5 |
| 60 | tap water | Yes | 5 | 5 | 7 |
| 61 | tap water flood | Yes | 5 | 3–4 | 6–7 |
| 62 | L-35 | Yes | 5 | 1 | 5 |
| 63 | AqI | No | 5 | 4 | 7 |
| 64 | GA | Yes | 5 | 4–5 | 8 |
| 65 | D | Yes | 5 | 1 | 4 |

AnI = anhydrous isopropanol
L-35 = 0.5% low molecular weight nonionic surfactant in deionized water composition
AqI = 10% isopropanol in deionized water composition
GA = a gum arabic solution
D = lithographic desensitizer

EXAMPLE 11

Two non-pigmented, additive lithographic plates were brush grained, acid etched, anodized, and sub-based, having a water-soluble diazo layer and a photopolymer layer thereover of about 25 mg/sq. ft. were exposed with a Nuarc exposure unit and developed with Black-One-Step developer. One of these plates, not manufactured according to this invention, was exposed for 90 seconds to give a step 6 full step image and a step 10-11 visible step image. The other plate was treated by applying a 0.5 weight percent aqueous solution of a low molecular weight nonionic surfactant for 30 seconds, followed by rinsing with tap water, the exposure time being 10 seconds. Despite the exposure time of one ninth that of the first plate, this second plate had a very good visible image with a step 5-6 full step and a step 12-13 visible step.

EXAMPLE 12

Presensitizd additive lithographic plates of brush grained aluminum that were not acid etched or anodized and that had a diazo layer but not a polymer layer were exposed by a Nuarc exposure unit and were developed with Black-One-Step developer. One of the plates was not treated according to this invention and was exposed for 135 seconds, showing a step 5 full step image and a step 12 visible step image. Another untreated plate was exposed for only 20 seconds to give a step 1 full step and a step 6 visible step. Yet another of these plates was treated by immersion for 30 seconds within 0.5 weight percent low molecular weight nonionic surfactant, followed by rinsing, exposure for 20 seconds and development, to give a full step of less than one step and a visible step of 7. These latter two plates showed evidence of poor lacquer adhesion.

EXAMPLE 13

Several 3M XN lithographic plates having a diazo layer and a blue polymer layer were exposed in a Berkey-Addalux exposure unit and then developed with 3M subtractive developer. An unmodified XN plate was exposed for a conventional exposure time for this plate and unit, 15 seconds, to give an image of step 6 full steps and step 7 visible steps. Another two XN plates were treated for 30 seconds using tap water and a cotton pad, followed by rinsing with tap water. One of these was exposed for 15 seconds to an image of a step 10 full step and a step 12 visible step; the other plate was used as an ultra high speed plate by exposing it for 4 seconds to image at a step 4-5 full step and a step 7 visible step. Another such plate was treated with an extracting agent composition of 20 percent n-propyl alcohol and 0.01 weight percent of a high molecular weight nonionic surfactant in deionized water, was not rinsed, was exposed for 6 seconds in the Berkey- Addalux unit and developed with 3M subtractive developer to give a step 6 solid step and step 8 visible step image. Yet another XN plate was treated with an extracting agent of tap water; without subsequent rinsing, this plate was exposed for 6 seconds in the same unit and developed, the image being a step 7 solid step and a step 10 visible step.

EXAMPLE 14

A 3M "T" lithographic plate including diazo pink polymer layers was exposed for 10 seconds in a Berkey-Addalux unit and developed with 3M subtractive developer to give a step 6 full step and a step 7 visible step. Another such plate treated according to this invention for 30 seconds by tap water and a cotton pad, followed by a tap water rinse was similarly exposed to attain substantially the same step values.

EXAMPLE 15

Some lithographic plates having brush grained aluminum backings that were not anodized or etched, and were subbased, coated with a diazo layer and then with a blue polymer layer thereover, were exposed in a Berkey-Addalux unit and developed. One of the plates that was not modified according to this invention was exposed for 10 seconds, giving a step 5 full step and a step 7 visible step image; a second plate was treated for 30 seconds with tap water and a cotton pad, followed by rinsing with tap water, and exposure for 10 seconds to give an image of step 11-12 full step and step 14 visible step; a third plate treated in the same manner as the second plate was exposed for only 2 seconds for a step 5-6 full step and a step 11 visible step; and a fourth plate treated in the same manner as the second plate was exposed for but a single second to give a step 3-4 full step and a step 6 visible step.

EXAMPLE 16

Three plates that were not brushed grained, not acid etched, not anodized, but were subbased with a diazo layer and a blue polymer overlayer were exposed in a Berkey-Addalux mercury unit and developed. A first, unmodified plate, after exposure for 10 seconds, gave a step 3-4 full step and a step 6 visible step. Another plate treated for 30 seconds with tap water, followed by tap water rinsing and exposure for 10 seconds gave a step 4-5 full step and a step 10 visible step, while a substantially identically treated plate exposed for 5 seconds gave a step 2-3 full step and a step 4-5 visible step.

EXAMPLE 17

Three plates having grained aluminum backings that were anodized, subbased, and which were coated with a diazo layer but not a polymer layer were exposed in a Berkey-Addalux unit and developed with Black-One-Step developer. An unmodified plate was exposed for 30 seconds to give a step 6 full step and a step 11-12 visible step. Treating another of the plates for 30 seconds in water, followed by rinsing, and a 30 second exposure gave a step 10 full step and a step 13 visible step, while a substantially identical plate exposed for 10 seconds and developed with a different additive developer gave a step 3-4 full step and a step 8 visible step, although these two latter plates showed evidence of poor lacquer adhesion.

EXAMPLE 18

An Enco N-100 subtractive plate believed to include a single coating of a resin and a solvent-soluble diazo material, was exposed for 6 seconds in a Berkey-Addalux exposure unit and developed with Enco substractive developer to give a step 2 solid and a step 4 visible image. Modification of another Enco N-100 plate by treatment with an extracting agent composition of 20 weight percent n-propyl alcohol and 0.01 weight percent of a high molecular weight nonionic surfactant in deionized water, exposure and development in the same manner and for the same time period showed a step 4 solid and a step 6 visible image, a speed increase of about 2 times.

An Enco N-50 subtractive plate, believed to be similar to the N-100 plates, when subjected to the same 6 second exposure and development, gave a step 3 solid and a step 5 visible image, while another Enco N-50 plate treated with water gave a step 4 solid and a step 6 visible image after a 6 second exposure and a development.

Two Enco N-200 lithographic plates when exposed for 6 seconds in a Berkey-Addalux unit and developed with Enco subtractive developer, an unmodified plate giving a step 3 solid and a step 4 visible image. Treating another such plate with water only gave a step 3 solid and a step 5 visible image, while prewashing with a solution of 20 weight percent n-propyl alcohol and 0.01 weight percent of high molecular weight nonionic surfactant and deionized water followed by the same exposure and development gave an increase in photospeed of about 2 times, as indicated by a step 5 solid and step 7 visible image.

EXAMPLE 19

Some presensitized subtractive lithographic plates having a combined diazo and polymer layer were prepared by coating a cinnamate photopolymer and a solvent-soluble diazo from the same coating solution. This solution was coated as a single layer on a brush-grained anodized aluminum substrate. Exposure of this plate for 30 seconds in a Berkey-Addalux exposure unit and development with Black-One-Step developer gave a step 6 solid and step 10 visible image. Another such plate was treated with the solution of Example 18 and similar exposure and development gave a step 6 solid and a step 11 visible image. Another such plate was treated with 20 weight percent ethylene glycol monomethyl ether in deionized water, was similarly exposed and developed, and gave a step 6-7 solid and a step 11 visible image.

EXAMPLE 20

This example illustrates that the preferred application procedure according to this invention can bring about superior photospeed increases. An additive presensitized polymer coated plate was treated with the extracting agent composition of Example 18 by using a 3R developing pad, followed by having the plate squeegeed; exposure for one second in a Berkey-Addalux unit and development with Black-One-Step developer resulted in 3 solid and 7 visible steps. Another substantially identical plate made from the same backing coil was immersed in the same extracting agent composition and then was passed between the rollers of a two-roller diazo wipe-on mechanical coating machine to squeegee off the excess extracting agent, followed by equivalent exposure and development to give a 5-6 solid and an 11 visible step image. These runs were made with immersion times of 5, 10 and 30 seconds, respectively, with essentially identical results.

EXAMPLE 21

In this example, lithographic plates were exposed with a Laserite argon laser exposure unit (EOCOM Corporation). Wipe-on diazo plates not according to this invention were sufficiently exposed at 9–12 mj/cm$^2$ of energy from the argon laser. At the optimum (not maximum) scan speed, 97 second scan of entire page, the laser intensity at the exposure platen must be 400–500 mw to give this exposure energy while scanning, without operating the argon writing laser at maximum output. This 97 second scan gives 1000 lines/in. spacing between consecutive scans. Faster scanning (59 second per page maximum) causes some loss of resolution (600 lines/in.) and some chatter in the scan drive system if the drive screw is not kept scrupulously clean. This chatter can cause spurious exposures on the plates, usually in the form of solid lines across the plate in the scanning direction. Faster scanning also reduces the exposure, because, even though the scanning beam travels at the same speed, consecutive scans do not overlap as much.

Plates of the general type used in Example 20 were treated with the extracting agent composition of Example 18, and were exposed by Laserite unit at 560 and 400 mw (12.1 and 9.1 mg/cm$^2$, respectively for 97 second scan) and found the plates to be overexposed, as indicated by plugged shadows in the halftone areas of the plate. The laser intensity was further reduced to 250 mw or 5.7 mj/cm$^2$ exposure; this exposure was adequate, a solid step 2 image being produced by the laser exposure. Further reductions in exposure, made by increasing the scan speed, gave slightly shorter step wedges: at a total scan time of 78 seconds or about 4.6 mj/cm$^2$, one of these plates gave slightly less than 2 steps and was substantially sufficiently exposed. At a 59 second scan or about 3.4 mj/cm$^2$, another gave a solid one step, was definitely underexposed, and individual scan lines could be seen in half-tones and solids due to less overlap at 600 lines/in.

Four other plates of this same type were identically sensitized and exposed in the Laserite unit with laser intensity 250 mw, scan time 97 seconds and exposure 5.7 mj/cm$^2$. The plates were hand developed with Black-One-Step developer and gummed. A total of 24,000 copies of a newspaper edition were made by printing "two up" (two plates per page), each plate printing about 12,000 copies. Wipe-on plates were simultaneously used for printing other copies in this edition, these plates having been conventionally exposed and machine processed. The plates according to this invention rolled up more rapidly than the conventional plates and printed well throughout the run.

EXAMPLE 22

Three different types of subtractive presensitized diazo plates were treated with the extracting agent composition of Example 18 and other such plates were treated with a second extracting agent composition of 6 weight percent isopropyl alcohol, 0.05 weight percent of a high molecular weight nonionic surfactant, 1 weight percent sodium acetate trihydrate, and the balance deionized water. These plates, which were of the types reported on in Examples 1, 2 and 8, were esposed on the Laserite laser exposure unit of Example 21 at three different scan speeds and a laser intensity of 250 mw, the three speeds being 600 lines/in., 3.2 mj/cm$^2$, 1000 lines/in., 5.7 mj/cm$^2$, and 1800 lines/in., 10.3 mj/cm$^2$. The two slower speed exposures were generally insufficient to prevent developing away some part of the image and gave less than a solid two steps on the wedge, while the exposures at 10.3 mj/cm$^2$ were substantially sufficient. Generally identical testing using a different Laserite unit having slower scan speeds for the same line spacing and using galvanometers for deflection of the laser beam rather than a rotating mirror of the other Laserite unit of this Example, so the incident energy calculations probably do not correspond fully, gave, on exposure, 3–4 solid steps at 12 mj/cm$^2$, which is an extremely advantageous step value for a laser exposed plate.

EXAMPLE 23

A group of additive plates that were made from the same backing coil and that included a photochromic dye were treated with an extracting agent composition including 5 percent n-propyl alcohol, 0.01 percent of the nonionic surfactant used in the formulation of Example 3, 0.1 percent of 85% phosphoric acid, and the balance deionized water, by immersing the plates therein for about 15 to 30 seconds and then passing the plates through a wipe-on plate roller coater machine having no solution in the pan in order to squeeze the plates, after which the plates were allowed to dry for one or two minutes.

The thus treated plates were stacked in a laser unit of the type used in Example 21 set for an 83-second, low-level exposure at 260 mw (about 6.5 mj/cm$^2$ and about 1000 lines/in.), followed by hand development with Black-One-Step developer and gummed. Step wedge results showed a full step of slightly less than 2 and a visible step of 4. A visible image was formed by the photochromic dye. These plates were then used for printing newspaper pages with inexpensive newspaper printing ink at a run length of 23,000 impressions, during which run the plates printed well and cleanly. Other pages of the same issue of the newspaper were printed with the same source of printing ink, but laser-developed wipe-on diazo plates were used instead of the plates according to this invention, with the result that some toning was observed after the 23,000 impressions.

Seven of the very plates according to this invention that had provided the 23,000 impressions run were run for an additional 41,000 impressions, and all seven printed satisfactorily, three of these plates still giving perfectly clean crisp, and dark impressions, while the other four, although still clean and crisp, showed some signs of print lightening, believed to be caused by the relatively low level of exposure to which these plates had been subjected.

EXAMPLE 24

Another additive plate substantially identical with and made from the same backing coil as the plates of Example 23 but that was not treated according to the present invention was subjected to the same laser exposure conditions specified in Example 23. A transient image was initially observable during development and was removed during completion of the development operation. No useful image was formed, and no step wedges were apparent.

It will apparent to those skilled in this art that the present invention can be embodied in various forms;

accordingly, this invention is to construed and limited only by the scope of the appended claims.

I claim:

1. A method of transforming a presensitized lithographic plate into an ultra high speed presensitized lithographic plate comprising:
   selecting a plate having a photosensitive negative-working diazonium material from the group consisting of diazonium compound or diazonium resin layer thereon; and
   treating said substrate surface prior to exposure thereof by contacting said diazonium layered surface with an extracting agent composition, said extracting agent composition being one in which said diazonium material is highly soluble and being a composition that does not significantly adversely affect said presensitized plate, said treating procedure including applying said extracting agent composition to said substrate surface for a length of time sufficient to solublize and extract into said composition substantially all of said diazonium material, and thereafter removing from the plate a substantial amount of said composition into which said diazonium material has been extracted, whereby the quantity of said diazonium material after said treating procedure is of sufficient quantity in said layer to form a lithographic image on the plate.

2. The transforming method of claim 1, wherein said treating procedure includes applying said extracting agent by immersing said presensitized plate therewithin, and thereafter scraping said plate for removing a substantial amount of said composition and diazonium material within said extracting agent composition.

3. The transforming method of claim 1, wherein said treating procedure includes applying said extracting agent composition for a time period not longer than about 3 minutes.

4. The transforming method of claim 1, wherein said treating procedure includes applying said extracting agent composition for a time period between about 5 seconds and about 60 seconds.

5. The transforming method of claim 1, wherein said treating procedure includes rinsing said extracting agent composition off of said plate substrate surface.

6. The transforming method of claim 5, wherein said treating procedure includes applying a stabilizer to said substrate surface at about the same time as said rinsing step.

7. The transforming method of claim 1, wherein said treating procedure includes applying a stabilizer to said substrate surface at substantially the same time that said extracting agent composition is applied thereto.

8. The transforming method of claim 1, wherein said extracting agent composition is water.

9. The transforming method of claim 1, wherein said extracting agent composition is selected from the group consisting of water, tap water, deionized water, distilled water, stabilizers, organic solvents, aqueous blends including a surfactant, aqueous blends including an organic solvent, aqueous blends including acidic, basic or salt additives, and combinations thereof.

10. The transforming method of claim 9, wherein said aqueous blends include at least about 30 weight percent water.

11. The transforming method of claim 1, wherein said extracting agent composition has a pH between about 1 and about 12.

12. The transforming method of claim 1, wherein said extracting agent composition has a pH not greater than about 7.

13. A method for preparing an ultra high speed presensitized lithographic plate comprising:
   selecting a backing member having a substrate surface exhibiting a propensity for adhesion of diazonium materials thereto;
   coating a layer containing a photosensitive negative-working diazonium compound or diazonium resin material onto said substrate surface to form a presensitized plate; and
   treating said presensitized plate having said diazonium material thereon to form an ultra high speed plate by contacting said presensitized plate with an extracting agent composition, said extracting agent composition being one in which said diazonium material is highly soluble and being a composition that does not significantly adversely affect said presensitized plate, said treating procedure including applying said extracting agent composition to said presensitized plate for a length of time sufficient to solubilize and extract into said extracting agent composition substantially all of said diazonium material, and thereafter removing from the plate a substantial amount of said composition into which said diazonium material has been extracted, whereby the quantity of said diazonium material after said treating procedure is of sufficient quantity in said layer to form a lithographic image on the plate, said treating procedure being carried out prior to exposure of the ultra high speed plate.

14. The method of claim 13, wherein said substrate is grained.

15. The method of claim 13, further including a stabilizer on said substrate surface, said stabilizer enhancing the shelf life of the ultra high speed plate.

16. The method of claim 13, wherein said thickness of said diazonium layer after said treating procedure is not much greater than about 0.05 mg of diazonium material per square foot of substrate surface.

17. The method of claim 13, further comprising enhancing said propensity of the substrate surface for adhesion of diazonium materials thereto by increasing its hydrophilic properties.

18. The method of claim 13, wherein said diazonium material coating step applies a composition including diazonium material and a polymeric substance.

19. The method of claim 13, wherein said diazonium material layer coating step is followed by a step of overcoating a polymeric substance to a layer of a thickness permitting removal of said diazonium material therethrough.

20. The method of claim 13, wherein said treating procedure includes rinsing said extracting agent composition off of said plate substrate surface.

21. The method of claim 13, wherein said treating procedure includes applying a stabilizer to said substrate surface.

22. The method of claim 13, wherein said extracting agent composition is selected from the group consisting of water, tap water, deionized water, distilled water, stabilizers, organic solvents, aqueous blends including a surfactant, aqueous blends including an organic solvent, aqueous blends including acidic, basic or salt additives, and combinations thereof.

23. The method of claim 18 wherein said composition applied during the coating step includes a dye or pigment.

24. The method of claim 18, wherein said composition applied during the coating step includes a photochromic dye.

25. The method of claim 19, wherein said overcoating step applies a composition of said polymeric substance and a dye or pigment.

26. The method of claim 19, wherein said overcoating step applies a composition of said polymeric substance and a photochromic dye.

* * * * *